(12) United States Patent
Adachi

(10) Patent No.: US 11,909,170 B2
(45) Date of Patent: Feb. 20, 2024

(54) SEMICONDUCTOR LIGHT EMITTING DEVICE AND OPTICAL SUBASSEMBLY

(71) Applicant: Lumentum Japan, Inc.

(72) Inventor: Koichiro Adachi, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 252 days.

(21) Appl. No.: 17/357,351

(22) Filed: Jun. 24, 2021

(65) Prior Publication Data

US 2022/0158410 A1    May 19, 2022

(30) Foreign Application Priority Data

Nov. 17, 2020 (JP) ................................ 2020-190747
Mar. 15, 2021 (JP) ................................ 2021-040959

(51) Int. Cl.
| | |
|---|---|
| *H01S 5/00* | (2006.01) |
| *H01S 5/023* | (2021.01) |
| *H01S 5/02* | (2006.01) |
| *H01S 5/026* | (2006.01) |
| *H01S 5/02345* | (2021.01) |
| *H01S 5/0239* | (2021.01) |

(Continued)

(52) U.S. Cl.
CPC .............. *H01S 5/023* (2021.01); *H01S 5/026* (2013.01); *H01S 5/0207* (2013.01); *H01S 5/0239* (2021.01); *H01S 5/02325* (2021.01); *H01S 5/02345* (2021.01); *H01S 5/0427* (2013.01); *H01S 5/06226* (2013.01); *H01S 5/06251* (2013.01)

(58) Field of Classification Search
CPC .... H01S 5/023; H01S 5/0207; H01S 5/02325; H01S 5/02345; H01S 5/0239; H01S 5/026; H01S 5/0427; H01S 5/06226; H01S 5/06251
See application file for complete search history.

(56) References Cited

U.S. PATENT DOCUMENTS

| | | | | |
|---|---|---|---|---|
| 6,057,954 | A  * | 5/2000 | Parayanthal | .......... G02F 1/0327 372/38.1 |
| 2005/0018941 | A1 * | 1/2005 | Coldren | .......... H01L 31/035236 359/326 |

(Continued)

FOREIGN PATENT DOCUMENTS

JP      H10275957 A      10/1998

*Primary Examiner* — Kinam Park
(74) *Attorney, Agent, or Firm* — Harrity & Harrity, LLP

(57) ABSTRACT

A semiconductor light emitting device includes a microstrip substrate with a single-ended transmission line on a top surface, wherein the single-ended transmission line extends from a first end portion to a second end portion, the microstrip substrate has a ground plane on a bottom surface, and the ground plane is opposed and bonded to the conductive pattern. The single-ended transmission line includes a first section and a second section, wherein the second section extends from the first section and includes the second end portion. The second section is lower in characteristic impedance than the first section. A load circuit that includes the wire, the optical modulator, and the termination resistor is electrically connected between the second end portion and the conductive pattern. The load circuit is equal to or lower in the characteristic impedance than the second section.

17 Claims, 11 Drawing Sheets

(51) Int. Cl.
    *H01S 5/042*     (2006.01)
    *H01S 5/062*     (2006.01)
    *H01S 5/0625*     (2006.01)
    *H01S 5/02325*     (2021.01)

(56) References Cited

U.S. PATENT DOCUMENTS

| | | | |
|---|---|---|---|
| 2005/0139843 A1* | 6/2005 | Sasada | G02B 6/4201 257/82 |
| 2010/0232806 A1* | 9/2010 | Kagaya | H05K 1/0246 398/183 |
| 2018/0278019 A1* | 9/2018 | Yamauchi | H01S 5/0233 |
| 2019/0237934 A1* | 8/2019 | Adachi | H04B 10/505 |

\* cited by examiner

US 11,909,170 B2

SEMICONDUCTOR LIGHT EMITTING DEVICE AND OPTICAL SUBASSEMBLY

CROSS-REFERENCE TO RELATED APPLICATION

The present application claims priority from Japanese patent applications JP2020-190747 filed on Nov. 17, 2020 and JP2021-040959 filed on Mar. 15, 2021, the contents of which are hereby expressly incorporated by reference herein.

TECHNICAL FIELD

This disclosure relates to a semiconductor light emitting device and an optical subassembly.

BACKGROUND

An optical modulator for optical communication can generate optical signals in response to an input of high-frequency electrical signals. Typically, high-frequency electrical signals deteriorate in quality on a transmission line, and accordingly, the optical signals also deteriorate. In some cases, a short bonding wire can be used to reduce deterioration of high-frequency characteristics.

A source of the high-frequency electrical signals and the transmission line can be a 50Ω termination system in a single-ended drive. In many cases, the characteristic impedance of the optical modulator is not 50Ω. This causes a mismatch of characteristic impedances, with the optical modulator, which thereby generates a reflection of the high-frequency electrical signals, degrades quality of the high-frequency electrical signals, and degrades quality of the optical signals. For example, a 3-dB down bandwidth of the electric/optical response can be narrowed.

Some implementations described herein reduce an impact caused by a mismatch of characteristic impedances.

In some implementations, a semiconductor light emitting device includes: a sub-mount with a conductive pattern on an upper surface; an optical modulator with an upper electrode on a top surface and a lower electrode on a bottom surface, wherein the lower electrode may be opposed and bonded to the conductive pattern; a termination resistor connected in parallel to the optical modulator; a microstrip substrate with a single-ended transmission line on a top surface, wherein the single-ended transmission line extends from a first end portion to a second end portion, wherein the microstrip substrate has a ground plane on a bottom surface, and wherein the ground plane may be opposed and bonded to the conductive pattern; and a wire that has a pair of ends, wherein one of the pair of ends may be bonded to the upper electrode of the optical modulator, and another of the pair of ends may be bonded to the second end portion of the single-ended transmission line. The single-ended transmission line includes a first section and a second section, wherein the second section extends from the first section and includes the second end portion. The second section may be lower in characteristic impedance than the first section. A load circuit that includes the wire, the optical modulator, and the termination resistor may be electrically connected between the second end portion and the conductive pattern. The load circuit may be equal to or lower in the characteristic impedance than the second section.

In some implementations, the different characteristic impedances of the first section and the second section of the single-ended transmission line suppresses an impact caused by mismatch of the characteristic impedances with the optical modulator.

In some implementations, an optical subassembly includes the semiconductor light emitting device; and an electrical connector, wherein the electrical connector may be electrically connected to the first end portion of the single-ended transmission line.

DETAILED DESCRIPTION

Figure 1:
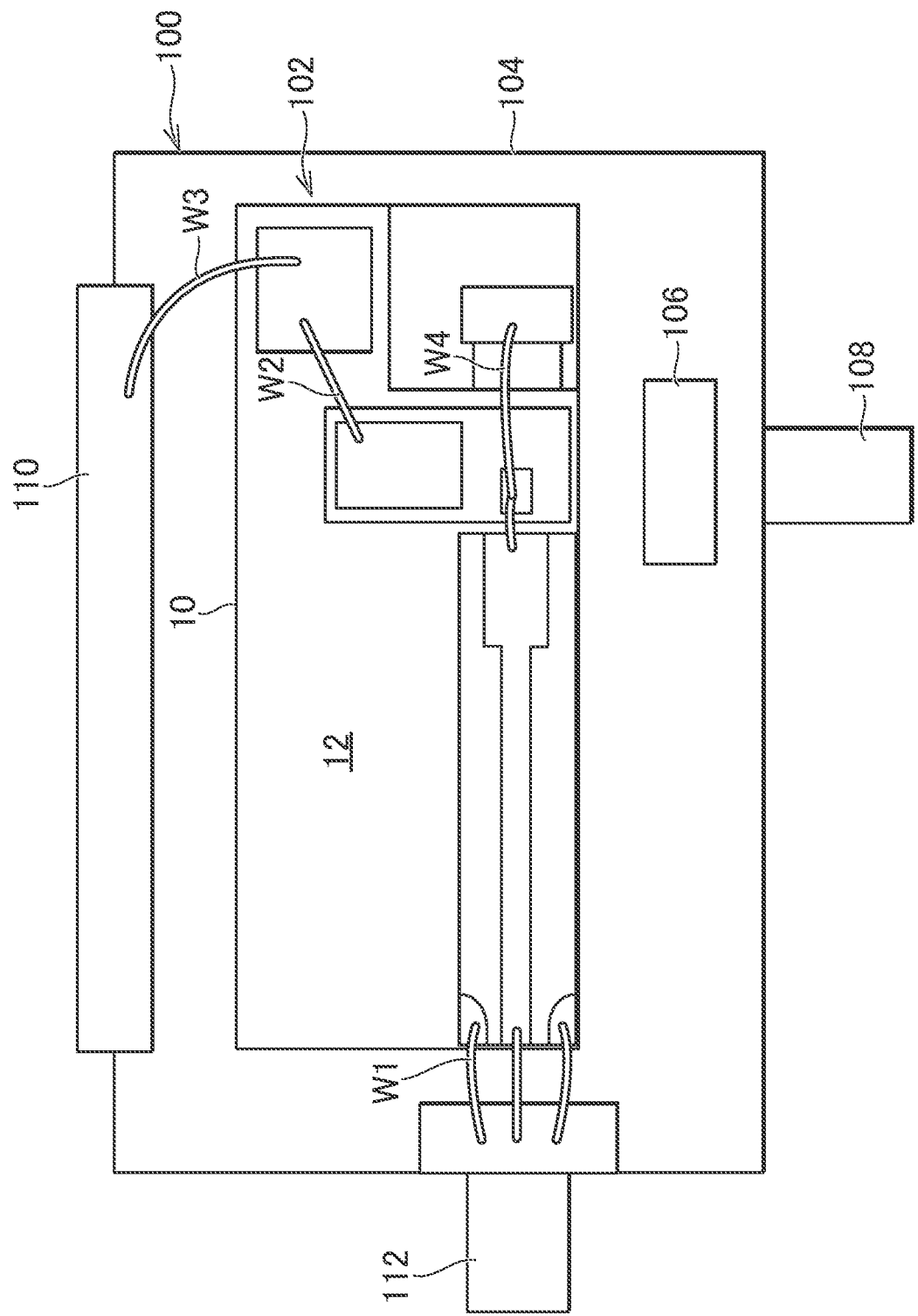
FIG. 1 is an internal configuration diagram of an example optical subassembly described herein.

Some implementations are specifically described in detail in the following with reference to drawings. In the drawings, the same members are denoted by the same reference numerals and have the same or equivalent functions, and a repetitive description thereof is omitted. The size of the figure does not necessarily coincide with the magnification.

FIG. 1 is an internal configuration diagram of an example optical subassembly. The optical subassembly 100 may contain a semiconductor light emitting device 102, which may be sealed within a box-shaped package 104. Optical signals may be output through a lens 106 and an optical connector 108 to the outside of the optical subassembly 100.

The optical subassembly 100 may have an electrical connector 110 on a side of the package 104 opposite to the optical connector 108. The electrical connector 110 may be adapted to electrically connect between an inside and an outside of the optical subassembly 100, and an unillustrated flexible substrate may be connected to the outside of the optical subassembly 100 (outside the package 104) to supply power.

The optical subassembly 100 may have a high-frequency connector 112 on a side of the package 104. The high-frequency connector 112 may electrically connect the inside and the outside the optical subassembly 100. It may be a GPPO connector. The high-frequency connector 112 may be configured to receive the high-frequency electric signals (e.g., at 56 Gbps).

The semiconductor light emitting device 102 may have a sub-mount 10. The sub-mount 10 may have a structure in which a surface of a ceramic substrate may be metallized. The sub-mount 10 may have a conductive pattern 12 on an upper surface. The conductive pattern 12 may be at a reference potential (e.g., a ground potential).

Figure 2:
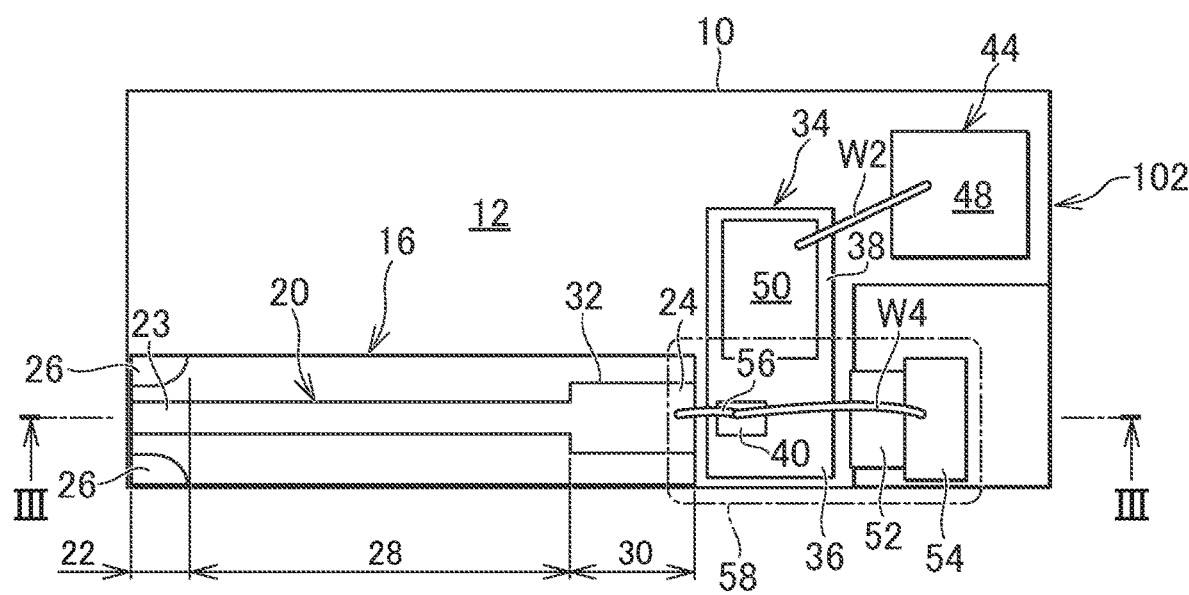
FIG. 2 is a plan view of an example sub-mount and example components mounted thereon.
Figure 3:
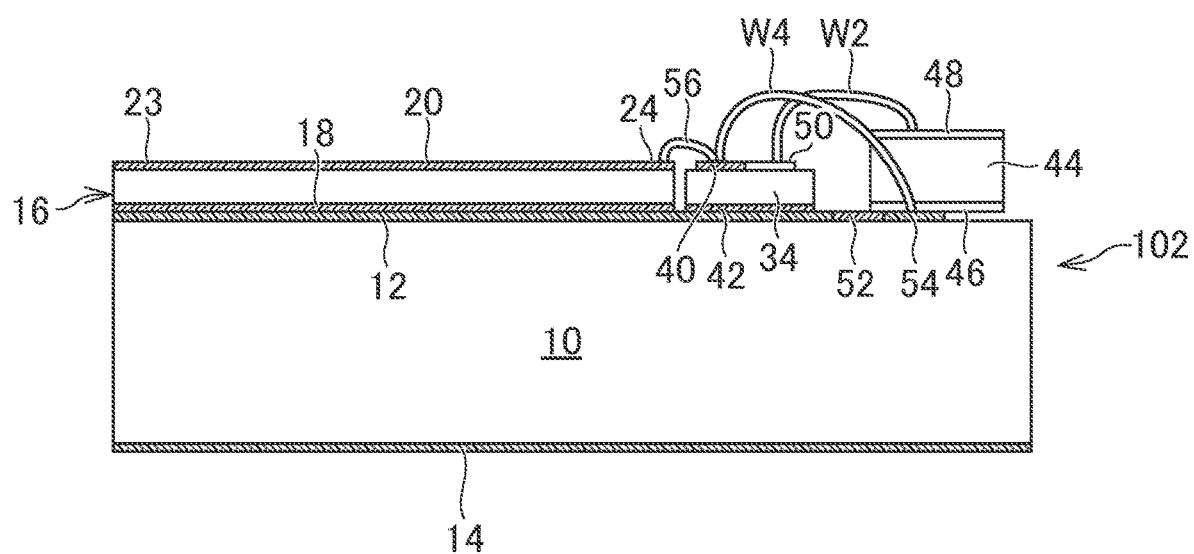
FIG. 3 is a cross-sectional view of the structure in FIG. 2.

FIG. 2 is a plan view of an example sub-mount 10 and example components mounted thereon. FIG. 3 is a cross-sectional view of the structure in FIG. 2. The entire back surface of the sub-mount 10 may be metallized. The conductive pattern 12 and a metal film 14 on the back surface may be electrically connected through unillustrated vias. A side surface of the sub-mount 10 may be metallized, thereby connecting the conductive pattern 12 and the metal film 14 on the back surface. Here, the lower side surface in FIG. 2 may be metallized. in some implementations, the side surface metallization may be omitted.

The semiconductor light emitting device 102 may have a microstrip substrate 16. The microstrip substrate 16 may have a structure in which electrical patterns are provided on two sides of a ceramic substrate.

The microstrip substrate 16 may have a ground plane 18 on a bottom surface. The ground plane 18 may be opposed and bonded to the conductive pattern 12 of the sub-mount 10, and thereby has the reference potential. Solder or conductive adhesive (not shown) may be used for bonding.

The microstrip substrate 16 may have a single-ended transmission line 20 on the top surface. The single-ended transmission line 20 may extend from the first end portion 23 to the second end portion 24. The first end portion 23 and the second end portion 24 may be at respective ends of the microstrip substrate 16 along the length direction of the single-ended transmission line 20. in some implementations, the single-ended transmission line 20 may not completely reach both ends of the ceramic substrate.

The single-ended transmission line 20 may include an external connection section 22, a first section 28, and a second section 30. The microstrip substrate 16 may have a pair of ground conductors 26 on the top surface, the pair of ground conductors 26 may sandwich the external connection section 22 of the single-ended transmission line 20. The pair of ground conductors 26 may be connected to the ground plane 18 through unillustrated vias. Part of the single-ended transmission line 20, the pair of ground conductors 26, and the ground plane 18 may comprise a grounded coplanar line. Or, a microstrip line without the pair of ground conductors 26 may be employed. The first end portion 23 may be in a region of the external connection section 22. Here, the grounded coplanar line described above may have a line width at 50Ω, which may be the same characteristic impedance as the drive system of the external electrical signals. Here, the line width of the single-ended transmission line 20 at the region of the external connection section 22 may be the same as the line width of the single-ended transmission line 20 at the region of the first section 28 (described herein), or the line widths may be different. However, in some implementations, the line widths of the single-ended transmission line 20 at the connection point between the external connection section 22 and the first section 28 are matched. The first end portion 23 of the single-ended transmission line 20 at the external connection section 22 and the pair of ground conductors 26 may be electrically connected to the high-frequency connector 112 (shown in FIG. 1), with a wire W1 used for a connection. Specifically, the wire W1 may be a GSG line, a signal wire may be connected to the first end portion 23 of the single-ended transmission line 20, and a pair of ground wires may be respectively connected to the pair of ground conductors 26.

The single-ended transmission line 20 may include the first section 28. The first section 28 may have a uniform width and may extend linearly. In other words, the first section 28 may be an area where the wire W1 may not be connected and which may be linearly elongated with the uniform width. With the ground plane 18 under the first section 28, a microstrip line may be constituted. The first section 28 may be set at 50Ω, which may be the same characteristic impedance of the external connection section 22 constituting the above-described grounded coplanar line. The first section 28 may not include the first end portion 23. Or, without the external connection section 22, the high-frequency connector 112 and the first section 28 may be connected. In this case, the region where the wire W1 may be connected may be the external connection section 22; the region where the single-ended transmission line 20 therefrom linearly extends with the uniform width may be the first section 28.

The single-ended transmission line 20 may include the second section 30. The second section 30 may extend from the first section 28. With the ground plane 18 under the second section 30, a microstrip line may be constituted. The second section 30 may have the same thickness as the first section 28. The second section 30 may include a broad portion 32 that may be wider in thickness than the first section 28. Thus, the second section 30 may have a lower characteristic impedance than the first section 28. The characteristic impedance of the second section 30 may be 45Ω. The broad portion 32 may include the second end portion 24 and the second section 30 may include the second end portion 24. The second end portion 24 may be the other end portion of the single-ended transmission line 20, and may be a region of the second section 30 where a wire 56 (described herein) may be bonded.

The semiconductor light emitting device 102 may have an optical semiconductor device 34 (e.g., EA/DFB lasers). An optical modulator 36, such as an electro-absorption modulator (EA modulator) or a Mach-Zehnder modulator (MZ modulator), and a semiconductor laser 38, such as a distributed feedback (DFB) laser, may be monolithically integrated into the optical semiconductor device 34.

The semiconductor laser 38 may be configured to oscillate continuous light by direct current injection. The optical modulator 36 may be configured to generate a high-frequency optical signal by absorbing the light from the semiconductor laser 38 in response to the input high-frequency electric signal.

The optical modulator 36 may have an upper electrode 40 on the top surface. The top surface of the optical modulator 36 may be as high as the top surface of the microstrip substrate 16. The optical modulator 36 may have a lower electrode 42 on the bottom surface. The lower electrode 42 may be opposed and bonded to the conductive pattern 12. Solder (not shown) may be used for bonding. In some implementations, the lower electrode 42 of the optical modulator 36 may be integrated with the lower electrode (not shown) of the semiconductor laser 38.

A capacitor 44 may be mounted on the sub-mount 10. The capacitor 44 may have a lower electrode 46 opposed and bonded to the conductive pattern 12. Solder or conductive adhesive (not shown) may be used for bonding. The capacitor 44 may have an upper electrode 48 connected to the upper electrode 50 of the semiconductor laser 38 through a wire W2. The capacitor 44 may be connected in parallel to the semiconductor laser 38, thereby suppressing inflow of high-frequency components to the semiconductor laser 38. The upper electrode 48 of the capacitor 44 may be connected to the electrical connector 110 through a wire W3, as shown in FIG. 1.

The semiconductor light emitting device 102 may have a termination resistor 52. The termination resistor 52 may be formed by metallization and patterning, and may be set to 50Ω. A pad 54 may be on the upper surface of the sub-mount 10, but without electrical continuity to the conductive pattern 12, and a termination resistor 52 may be connected between the conductive pattern 12 and the pad 54. The pad 54 and the optical modulator 36 may be connected through a wire W4. Thus, the termination resistor 52 may be connected in parallel to the optical modulator 36. The resistance value may be not limited to 50Ω and may be different in some implementations.

The semiconductor light emitting device 102 may have a wire 56. Both ends of the wire 56 may be respectively bonded to the upper electrode 40 of the optical modulator 36 and the second end portion 24 of the single-ended transmission line 20. In the example of FIGS. 2 and 3, the wire 56 and the wire W4 are one continuous wire.

The microstrip substrate 16 may be substantially as high as the optical semiconductor device 34, thereby shortening the wire 56 between the single-ended transmission line 20 and the optical modulator 36. This enables reduction of the inductance component due to the wire 56. Here, the length of the wire 56 may be preferably 150 μm or less. To achieve 150 μm or less, the difference in height between the microstrip substrate 16 and the optical semiconductor device 34 may be preferably within ±10%. Larger difference in height may make the wire 56 longer than 150 μm, whereby the inductance of the wire 56 degrades the high-frequency characteristics.

As shown in FIG. 2, a load circuit 58 that include the wire 56, the optical modulator 36, and the termination resistor 52 may be electrically connected between the second end portion 24 and the conductive pattern 12. The load circuit 58 may also include the pad 54. The load circuit 58 may be equal to or less in characteristic impedance than the second section 30. The characteristic impedance of the load circuit 58 may be 40Ω, which is smaller than 50Ω. The characteristic impedance may vary according to the frequency, but may be the average value of the entire driving frequency range. This definition may be the same in the single-ended transmission line 20.

The difference of the characteristic impedance may causes reflection of the high-frequency electrical signal, which may degrade the high-frequency characteristics. However, in some implementations, the characteristic impedance of the single-ended transmission line 20 changes from 50Ω to 45Ω, and may be connected to the load circuit 58 with 40Ω. Such gradual reduction of the characteristic impedance reduces the reflection of the electrical signal, whereby the high-frequency electrical signal, input to the first end portion 23 (external connection section 22), can be efficiently transmitted to the load circuit 58 and consequently to the optical modulator 36. This improves the high-frequency characteristics.

Figure 4:
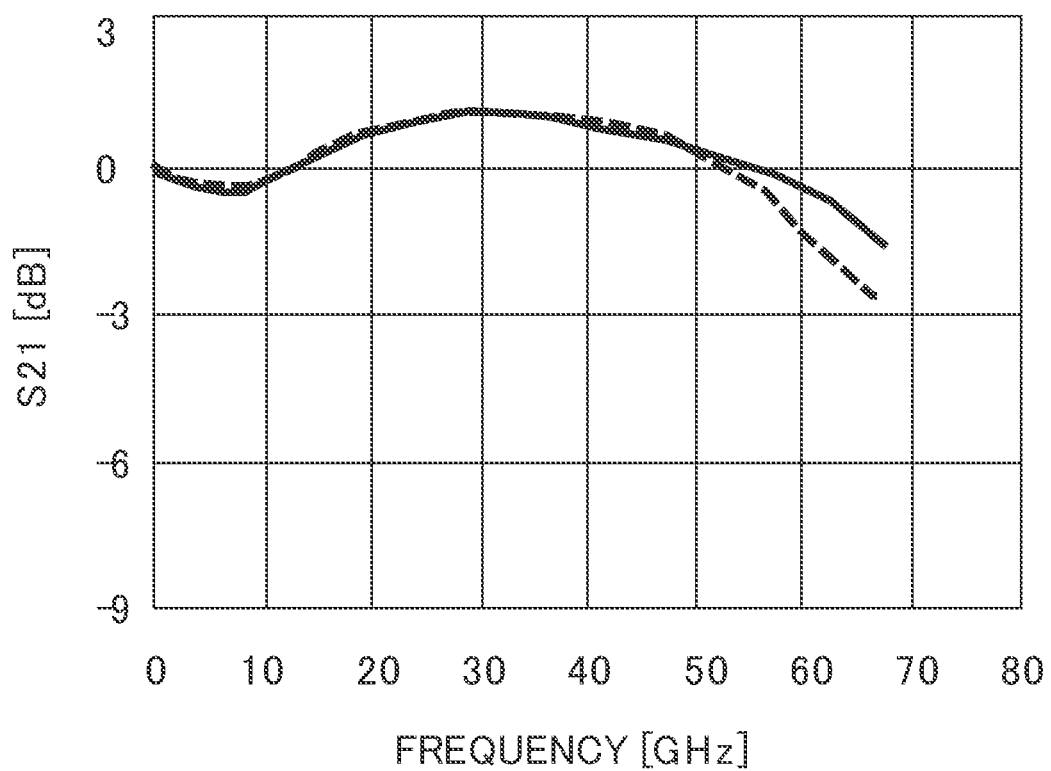
FIG. 4 is a diagram of response characteristics of an optical signal to a high-frequency electric signal (optical/electrical response characteristics).

FIG. 4 is a diagram of the response characteristics of an optical signal to a high-frequency electric signal (optical/ electrical response characteristics). The high-frequency electric signal may be input to the first end portion 23. The horizontal axis indicates frequency, and the vertical axis indicates responsiveness (S21). The solid line indicates the response characteristics of the some implementations described herein. The dotted line indicates the response characteristics of a comparative example. In the comparative example, the entire single-ended transmission line 20 has a uniform width with a uniform characteristic impedance. As one of the indices of the frequency response of the optical modulator 36, a frequency of −3 dB (f3 dB band) may be used. In some implementations described herein, a characteristic improvement of about 5 GHz was observed compared with the comparative example.

In some implementations described herein, the characteristic impedances of the first section 28, the second section 30, and the load circuit 58 are 50 Ω, 45Ω, and 40Ω, respectively. Alternatively, the characteristic impedances of the second section 30 and the load circuit 58 may be the same (40Ω). In this implementation, in spite of larger differences of the characteristic impedances between the first section 28 and the second section 30, actual measurements indicate that improvement of the high-frequency characteristics can be obtained.

This is because the electric field distribution in the single-ended transmission line 20 is cohesive to some extent, the electric field distribution changes little, and the reflection is small. In contrast, the load circuit 58 has a very complex configuration because it has a semiconductor region as well as an inductance component and a capacitance component, whereby the difference of the characteristic impedances at the related connections generate a large reflection. It is also important that the wire 56 be short. For example, assume that the microstrip substrate 16 is not disposed, and a single-ended transmission line is formed as a pattern on the sub-mount. In this example, a large reflection occurs between the region of the single-ended transmission line where the characteristic impedance is small and the wire 56 is located. By making the wire 56 less than or equal to 150 μm, the inductance of the wire 56 has a small impact on the characteristic impedance, which makes the second section 30 effective.

Figure 5:
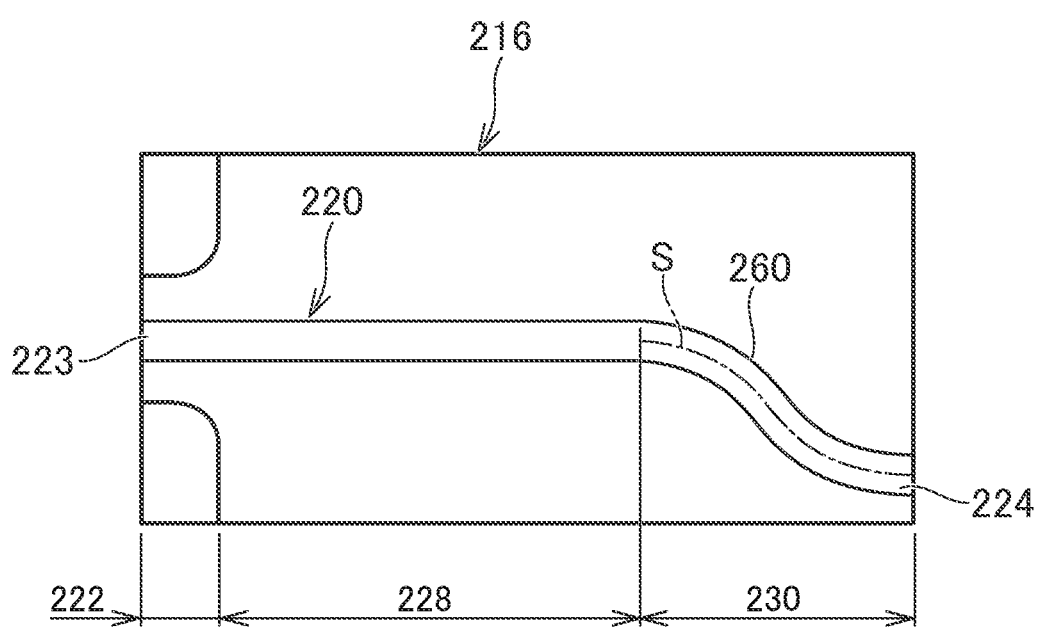
FIG. 5 is a plan view of an example microstrip substrate.

FIG. 5 is a plan view of an example microstrip substrate. The single-ended transmission line 220 may include the external connection section 222, the first section 228, and the second section 230. The second section 230 may include a curve portion 260. The curve portion 260 may extend along a curve convex in multiple directions (e.g., an S-shaped curve S). With the curve portion 260, the electromagnetic field spreads, which reduces the impedance of the second section 230. The second section 230 may be the same in width as the first section 228.

The first end portion 223 and the second end portion 224 may be at respective ends of the microstrip substrate 216 along the length direction (left-right direction in FIG. 5) of the single-ended transmission line 220. The first end portion 223 and the second end portion 224 may be at respective positions displaced from each other in the width direction (up-down direction in FIG. 5) perpendicular to the length direction. In the example of FIG. 1, the optical modulator may be disposed in front of the high-frequency connector 112, whereas the present example may be effective when both are displaced. This can enhance flexibility of component arrangement in the optical subassembly. What is described above in relation to FIGS. 1-4 may be applicable hereto.

The second section 230 may curve with a changing curvature and may include a linearly extending portion. Accordingly, the characteristic impedance of the second section 230 may vary depending on positions, but the characteristic impedance of the second section 230 may refer to the average characteristic impedance of the entire second section 230. In some implementations, the first section 228 may have a constant width and a constant characteristic impedance as well, and accordingly the same definition may be used.

Figure 6:
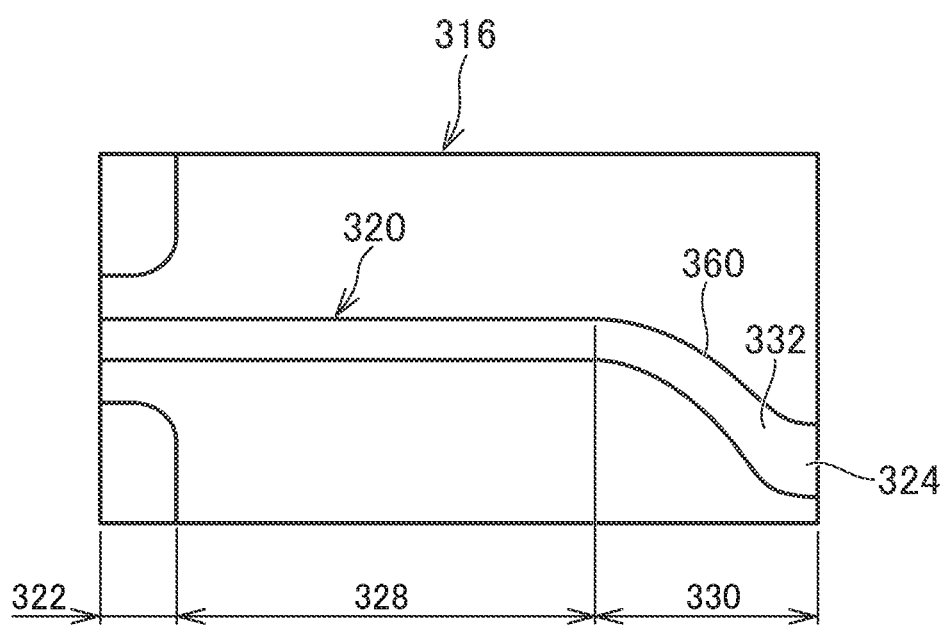
FIG. 6 is a plan view of an example microstrip substrate.

FIG. 6 is a plan view of an example microstrip substrate. The single-ended transmission line 320 may include the external connection section 322, the first section 328, and the second section 330. The second section 330 may include a broad portion 332 that may be wider in width than the first section 328. The broad portion 332 may have a gradually increased width in a direction away from the first section 328. The broad portion 332 may include the second end portion 324. The second end portion 324 may be widest at the second section 330. What is described above in relation to FIGS. 1-5 may be applicable hereto.

Combination of the curve portion 360 and the broad portion 332 can achieve a low impedance in a small area. This enables downsizing of the microstrip substrate 316. Therefore, it is possible to reduce the size of the optical subassembly itself.

Figure 7:
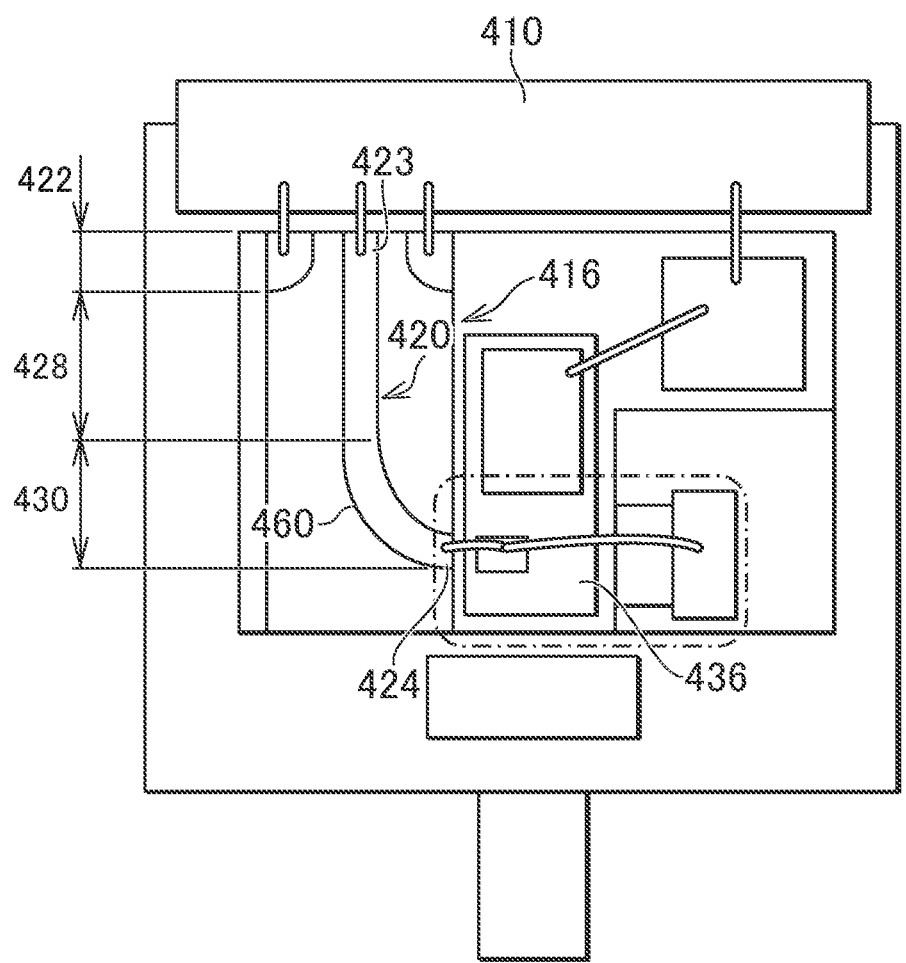
FIG. 7 is an internal configuration diagram of an example optical subassembly.

FIG. 7 is an internal configuration diagram of an example optical subassembly. A direction in which the high-frequency electric signal may be input may be parallel to another direction in which the optical signal may be output. The input and output of the high-frequency electric signal and the DC current are both adapted to be performed in the electrical connector 410. The electrical connector 410 may be adjacent to the microstrip substrate 416 in the length direction (up-down direction in FIG. 7). The microstrip substrate 416 may have the single-ended transmission line 420. The single-ended transmission line 420 may include the external connection section 422, the first section 428, and the second section 430.

In some implementations, the optical modulator 436 may be adjacent to the microstrip substrate 416 in the width direction (left-right direction in FIG. 7). Therefore, the single-ended transmission line 420 may curve substantially at 90 degrees. Specifically, the second section 430 may have a curved shape at 90 degrees with a uniform width. The characteristic impedance of second section 430 may be 43Ω. The low impedance may be achieved by having the curve portion 460.

The first end portion 423 may be at one of a pair of ends of the microstrip substrate 416 along the length direction of the first section 428. The second end portion 424 may be at one of a pair of sides of the microstrip substrate 416 along the width direction perpendicular to the length direction. The second section 430 may include the curve portion 460. The curve portion 460 may extend along a curve convex in one direction. What is described above in relation to FIGS. 1-6 may be applicable hereto.

Figure 8:
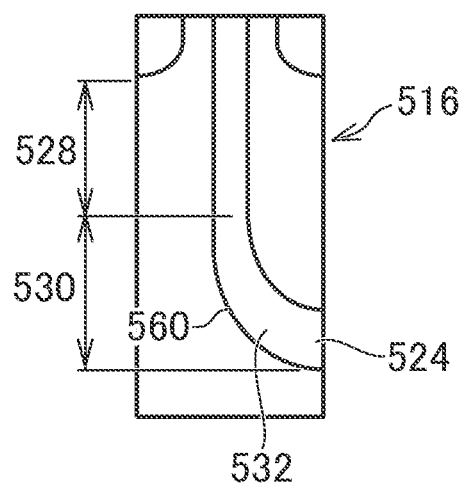
FIG. 8 is a plan view of an example microstrip substrate.

FIG. 8 is a plan view of a microstrip substrate. The second section 530 may include the broad portion 532 that may be wider in width than the first section 528. The broad portion 532 may have a gradually increased width. The broad portion 532 may include the second end portion 524. What is described above in relation to FIGS. 1-7 may be applicable hereto.

Combination of the curve portion 560 and the broad portion 532 can achieve a low impedance in a small area. This enables downsizing of the microstrip substrate 516. Therefore, it is possible to reduce the size of the optical subassembly itself.

Figure 9:
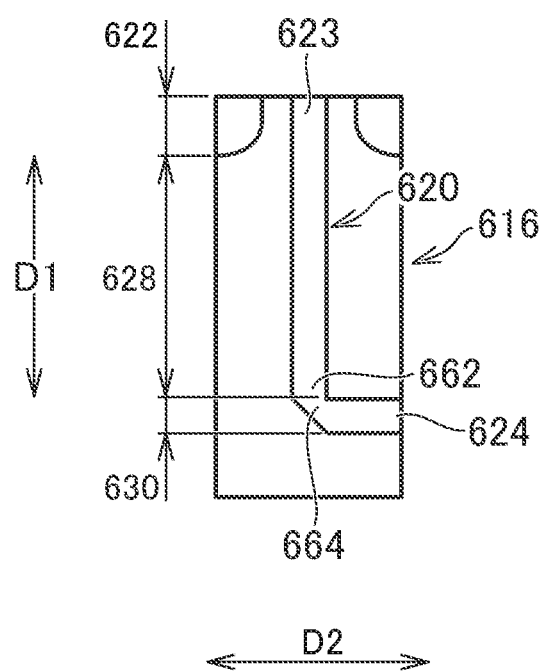
FIG. 9 is a plan view of an example microstrip substrate.

FIG. 9 is a plan view of an example microstrip substrate. The single-ended transmission line 620 may include the external connection section 622, the first section 628, and the second section 630. The first end portion 623 may be at one of a pair of ends of the microstrip substrate 616 along the length direction (up-down direction in FIG. 9) of the first section 628. The second end portion 624 may be at one of a pair of sides of the microstrip substrate 616 along the width direction (left-right direction in FIG. 9) perpendicular to the length direction. That is, the single-ended transmission line 620 may curve at a right angle. This can spread the electromagnetic field and can reduce the impedance of the second section 630.

The first section 628 may include the first connection portion 662 connected to the second section 630. The first section 628 may extend from the first connection portion 662 along the first direction D1.

The second section 630 may include the second connection portion 664 connected to the first section 628. The second section 630 may extend from the second connection portion 664 along the second direction D2 that intersects the first direction D1. The first section 628 and the second section 630 may extend in different directions.

The first connection portion 662 and the second connection portion 664 may be adjacent to each other in the first direction D1, but not in the second direction D2. Part of the second connection portion 664 may be narrower than the first connection portion 662. What is described above in relation to FIGS. 1-8 may be applicable hereto.

Figure 10:
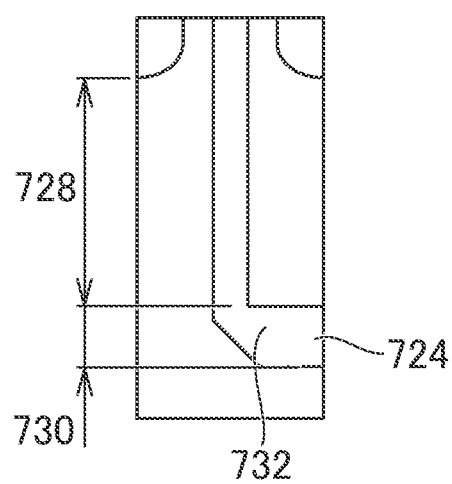
FIG. 10 is a plan view of an example microstrip substrate.

FIG. 10 is a plan view of an example microstrip substrate. The second section 730 may include the broad portion 732 that may be wider in width than the first section 728. The broad portion 732 may include the second end portion 724. What is described above in relation to FIGS. 1-9 may be applicable hereto.

Figure 11:
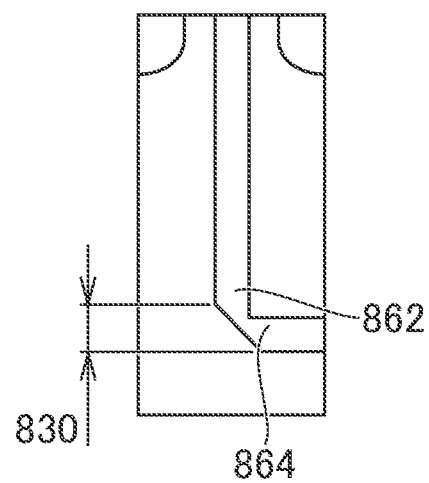
FIG. 11 is a plan view of an example microstrip substrate.

FIG. 11 is a plan view of an example microstrip substrate. Part of the second connection portion 864 may be narrower than part of the second connection portion 664 shown in FIG. 9. Accordingly, the characteristic impedance of the second section 830 may be adjustable. What is described above in relation to FIGS. 1-10 may be applicable hereto.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor light emitting device comprising:
   a sub-mount with a conductive pattern on an upper surface of the sub-mount;
   an optical modulator with an upper electrode on a top surface of the optical modulator and a lower electrode on a bottom surface of the optical modulator,
      wherein the lower electrode is opposed and bonded to the conductive pattern;
   a termination resistor connected in parallel to the optical modulator;
   a microstrip substrate with a single-ended transmission line on a top surface of the microstrip substrate,
      wherein the single-ended transmission line extends from a first end portion to a second end portion of the microstrip substrate,
      wherein the microstrip substrate has a ground plane on a bottom surface of the microstrip substrate, and
      wherein the ground plane is opposed and bonded to the conductive pattern; and a wire that has a pair of ends,
      wherein one of the pair of ends is bonded to the upper electrode of the optical modulator, and another of the pair of ends is bonded to the second end portion of the single-ended transmission line,
   wherein:
      the single-ended transmission line includes a first section and a second section,
         wherein the second section extends from the first section and includes the second end portion, and
         wherein the second section is lower in characteristic impedance than the first section,
      a load circuit that includes the wire, the optical modulator, and the termination resistor is electrically connected between the second end portion and the conductive pattern, and
      the load circuit is equal to or lower in the characteristic impedance than the second section.

2. The semiconductor light emitting device of claim 1, wherein:
   the single-ended transmission line includes an external connection section connected to the first section, and the external connection section includes the first end portion, and
   the microstrip substrate has a pair of ground conductors on the top surface of the microstrip substrate,
      wherein the pair of ground conductors sandwich the external connection section of the single-ended transmission line, and
      wherein the microstrip substrate partially constitutes a ground coplanar line.

3. The semiconductor light emitting device of claim 1, further comprising a semiconductor laser,
   wherein both the optical modulator and the semiconductor laser are monolithically integrated in an optical semiconductor device.

4. The semiconductor light emitting device of claim 1, wherein the top surface of the optical modulator is equivalent in height to the top surface of the microstrip substrate.

5. The semiconductor light emitting device of claim 1, wherein the first section linearly extends with a uniform width.

6. The semiconductor light emitting device of claim 1, wherein the second section has a broad portion wider in width than the first section.

7. The semiconductor light emitting device of claim 6, wherein the broad portion has a gradually increased width.

8. The semiconductor light emitting device of claim 6, wherein the broad portion includes the second end portion.

9. The semiconductor light emitting device of claim 1, wherein the first end portion and the second end portion are at respective ends of the microstrip substrate along a length direction of the single-ended transmission line, and are displaced from each other in a width direction perpendicular to the length direction.

10. The semiconductor light emitting device of claim 1, wherein
   the first end portion is at one of a pair of ends of the microstrip substrate along a length direction of the first section, and
   the second end portion is at one of a pair of sides of the microstrip substrate along a width direction perpendicular to the length direction.

11. The semiconductor light emitting device of claim 1, wherein the second section includes a curve portion.

12. The semiconductor light emitting device of claim 11, wherein the curve portion extends along a curve convex in one direction.

13. The semiconductor light emitting device of claim 11, wherein the curve portion extends along a curve convex in multiple directions.

14. The semiconductor light emitting device of claim 1, wherein
   the first section includes a first connection portion that is connected to the second section and extends from the first connection portion along a first direction,
   the second section includes a second connection portion that is connected to the first section and extends from the second connection portion along a second direction intersecting the first direction, and
   the first connection portion and the second connection portion are adjacent to each other in the first direction and are not adjacent to each other in the second direction.

15. The semiconductor light emitting device of claim 14, wherein the single-ended transmission line curves at a right angle.

16. The semiconductor light emitting device of claim 14, wherein the second connection portion has a portion narrower than the first connection portion.

17. An optical subassembly comprising:
   a semiconductor light emitting device comprising:
      a sub-mount with a conductive pattern on an upper surface of the sub-mount;
      an optical modulator with an upper electrode on a top surface of the optical modulator and a lower electrode on a bottom surface of the optical modulator,
         wherein the lower electrode is opposed and bonded to the conductive pattern;

a termination resistor connected in parallel to the optical modulator;

a microstrip substrate with a single-ended transmission line on a top surface of the microstrip substrate, wherein the single-ended transmission line extends from a first end portion to a second end portion of the microstrip substrate, wherein the microstrip substrate has a ground plane on a bottom surface of the microstrip substrate, and wherein the ground plane is opposed and bonded to the conductive pattern; and a wire that has a pair of ends, wherein one of the pair of ends is bonded to the upper electrode of the optical modulator, and another of the pair of ends is bonded to the second end portion of the single-ended transmission line, wherein:

the single-ended transmission line includes a first section and a second section, wherein the second section extends from the first section and includes the second end portion, and wherein the second section is lower in characteristic impedance than the first section, a load circuit that includes the wire, the optical modulator, and the termination resistor is electrically connected between the second end portion and the conductive pattern, and the load circuit is equal to or lower in the characteristic impedance than the second section; and an electrical connector, wherein the electrical connector is electrically connected to the first end portion of the single-ended transmission line.

* * * * *